United States Patent
Ogomi et al.

(10) Patent No.: US 12,306,273 B2
(45) Date of Patent: May 20, 2025

(54) MAGNETIC SENSOR DEVICE

(71) Applicant: Mitsubishi Electric Corporation, Tokyo (JP)

(72) Inventors: Tomokazu Ogomi, Tokyo (JP); Kazuki Yamauchi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 325 days.

(21) Appl. No.: 17/625,774

(22) PCT Filed: Jul. 17, 2020

(86) PCT No.: PCT/JP2020/027823
§ 371 (c)(1),
(2) Date: Jan. 10, 2022

(87) PCT Pub. No.: WO2021/024758
PCT Pub. Date: Feb. 11, 2021

(65) Prior Publication Data
US 2022/0244327 A1    Aug. 4, 2022

(30) Foreign Application Priority Data

Aug. 6, 2019   (JP) ................................ 2019-144767

(51) Int. Cl.
*G01R 33/09* (2006.01)
*G07D 7/04* (2016.01)

(52) U.S. Cl.
CPC ............. *G01R 33/091* (2013.01); *G07D 7/04* (2013.01)

(58) Field of Classification Search
CPC ...... G01R 33/02; G01R 33/09; G01R 33/091; G01R 33/093; G01R 33/095;
(Continued)

(56) References Cited

U.S. PATENT DOCUMENTS

2008/0191694 A1* 8/2008 Barton ................ G01R 33/09
324/252
2013/0127457 A1* 5/2013 Musha ................ G01R 33/095
324/252

(Continued)

FOREIGN PATENT DOCUMENTS

JP      6300908 B2    3/2018
JP      6316429 B2    4/2018

(Continued)

OTHER PUBLICATIONS

International Search Report and Written Opinion mailed on Oct. 13, 2020, received for PCT Application PCT/JP2020/027823, Filed on Jul. 17, 2020, 8 pages including English Translation.

(Continued)

*Primary Examiner* — David M Schindler
(74) *Attorney, Agent, or Firm* — XSENSUS LLP

(57) ABSTRACT

A magnetic sensor device includes a magnet that generates a magnetic field and sets of magnetoresistive elements arranged in a longitudinal direction that is perpendicular to a transport direction. Each of the sets of magnetoresistive elements includes a first and a second resistor. A midpoint of the first and the second resistor is matched with a center axis of the magnet in the transport direction. The first and the second resistor are arranged such that the distance therebetween increases from a distance between first ends of the first and the second resistor in the longitudinal direction to a distance between second ends of the first and the second resistor in the longitudinal direction. At least two sets of the first and the second resistor are arranged so as to be axisymmetric with respect to an imaginary line that is perpendicular to the longitudinal direction of the magnet.

3 Claims, 10 Drawing Sheets

(58) Field of Classification Search
CPC ...... G01R 33/096; G01R 33/098; G07D 7/04; G07D 7/00; G01B 7/14; G01D 5/142; G01D 5/145; G01D 5/147; H10N 50/10
See application file for complete search history.

(56) References Cited

U.S. PATENT DOCUMENTS

| | | | |
|---|---|---|---|
| 2015/0369882 A1* | 12/2015 | Mochizuki | H01F 7/0294 |
| | | | 324/252 |
| 2017/0052233 A1 | 2/2017 | Ogomi et al. | |
| 2017/0154487 A1* | 6/2017 | Asano | G07D 7/04 |
| 2017/0205474 A1 | 7/2017 | Ogomi et al. | |
| 2019/0377036 A1* | 12/2019 | Ogomi | G07D 7/04 |

FOREIGN PATENT DOCUMENTS

| WO | 2015/174409 A1 | 11/2015 |
|---|---|---|
| WO | 2016/013650 A1 | 1/2016 |

OTHER PUBLICATIONS

Chinese Office Action dated Dec. 31, 2024, issued for the corresponding CN patent application No. 202080052930.5 and the partial English translation, 11 pp.

\* cited by examiner

AREA IN WHICH BIAS MAGNETIC FIELD Bx IN X-DIRECTION IS NEGATIVE

AREA IN WHICH BIAS MAGNETIC FIELD Bx IN X-DIRECTION IS POSITIVE

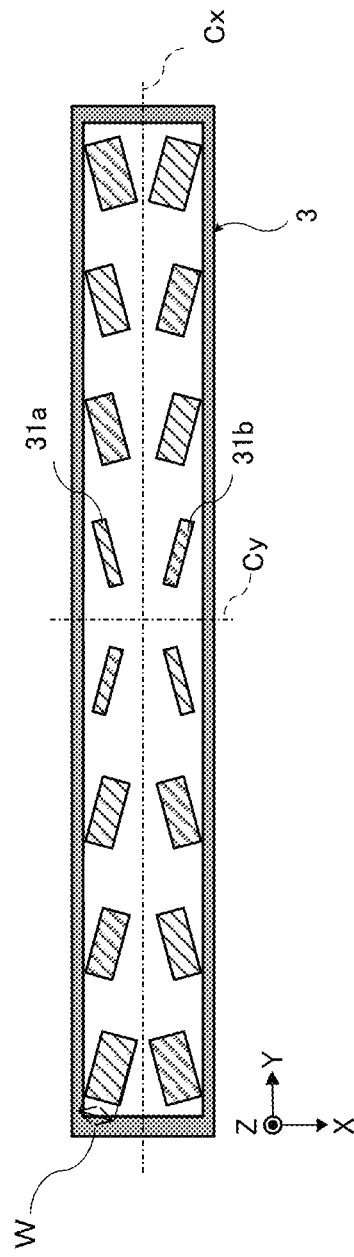

MAGNETIC SENSOR DEVICE

CROSS-REFERENCE TO RELATED APPLICATIONS

The present application is based on PCT filing PCT/JP2020/027823, filed Jul. 17, 2020, which claims priority to JP 2019-144767, filed Aug. 6, 2019, the entire contents of each are incorporated herein by reference.

TECHNICAL FIELD

The present disclosure relates to a magnetic sensor device.

BACKGROUND ART

A known magnetic sensor device includes multiple magnetoresistive elements with resistances that change in accordance with magnetic flux density. For example, a magnetic sensor device described in Patent Literature 1 includes multiple magnetoresistive elements to detect a magnetic pattern on a paper sheet medium such as a banknote with multiple channels.

To improve detection sensitivity, the magnetic sensor device described in Patent Literature 1 includes two bridge-connected magnetoresistive elements adjacent to each other in the transport direction (hereafter, X-direction).

CITATION LIST

Patent Literature

Patent Literature 1: Japanese Patent No. 6316429
Patent Literature 2: Japanese Patent No. 6300908

SUMMARY OF INVENTION

Technical Problem

A magnetoresistive element has the applied magnetic flux-resistance characteristics showing hysteresis. After reading a paper sheet medium, two bridge-connected magnetoresistive elements may be affected differently by hysteresis. The magnetoresistive elements affected differently by hysteresis can have the voltage division ratio also being affected and can then produce an unstable output signal.

In response to the above issue, the technique described in FIG. 9 in Patent Literature 1 uses each pair of magnetoresistive elements with a larger distance between the elements from one end toward the other end in the reading width direction. This structure can apply a stable bias magnetic field in the longitudinal direction of the magnetoresistive elements, that is the non-magnetosensitive direction, using a magnetic field in X-direction applied from a permanent magnet, and thus reduces changes in the resistance due to such hysteresis. The magnetoresistive elements can thus have stable output.

In an area in which a bias magnetic field By in Y-direction is negative, a component of the bias magnetic field By in Y-direction in the longitudinal direction of the magnetoresistive elements and a component of a bias magnetic field Bx in X-direction in the longitudinal direction of the magnetoresistive elements cancel each other. Thus, the magnetoresistive elements receive a weaker magnetic field applied in the longitudinal direction and are less likely to produce a stable output signal.

In response to the above issue, the structure described in Patent Literature 2 includes a micro magnet at an end of a magnet in the longitudinal direction to forcibly apply a magnetic field in the same direction as in the non-magnetosensitive direction of each anisotropic magnetoresistive element arranged in the line direction. However, the structure in Patent Literature 2 may complicate the structure of the magnet that applies a bias magnetic field.

In response to the above issue, an objective of the present disclosure is to provide a magnetic sensor device with a simple structure that can provide stable output.

Solution to Problem

To achieve the above objective, a magnetic sensor device includes a magnetic field generator that generates a magnetic field intersecting with a detection object, and a plurality of sets of magnetoresistive elements arranged on a line in a longitudinal direction that is perpendicular to a transport direction of the detection object. Each of the plurality of sets of magnetoresistive elements includes a first resistor and a second resistor arranged with a distance therebetween in the transport direction. A midpoint of the first resistor and the second resistor is matched with a center of the magnetic field generator in the transport direction. The magnetic field generator applies to a plurality of the first resistors and a plurality of the second resistors a magnetic field including a component in the transport direction of the detection object and a component in the longitudinal direction. The first resistor and the second resistor in each of the plurality of sets of magnetoresistive elements are arranged such that the distance increases from a distance between first ends of the first resistor and the second resistor in the longitudinal direction to a distance between second ends of the first resistor and the second resistor in the longitudinal direction. At least two sets of the first resistor and the second resistor are arranged so as to be axisymmetric with respect to an axis of the magnetic field generator that is perpendicular to the longitudinal direction.

Advantageous Effects of Invention

According to the magnetic sensor device according to the above aspect of the present disclosure, at least two sets of the first resistor and the second resistor are arranged so as to be axisymmetric with respect to the axis of the magnetic field generator that is perpendicular to the longitudinal direction. The component of the magnetic field in the transport direction and the component of the magnetic field in the longitudinal direction can thus be added together to be a magnetic field applied in the longitudinal direction of each resistor, irrespective of the orientation of the component of the magnetic field in the longitudinal direction of the magnetic field generator applied by the magnetic field generator. The magnetic sensor device with a simple structure can thus stably apply the magnetic field in the longitudinal directions of the resistors and is less likely to be affected by hysteresis and provide stable output.

BRIEF DESCRIPTION OF DRAWINGS

FIG. 11 is a top view of an AMR chip included in a magnetic sensor device according to Embodiment 4 of the present disclosure.

DESCRIPTION OF EMBODIMENTS

A magnetic sensor device according to one or more embodiments of the present disclosure is described.

Hereafter, the transport direction of an object to be detected, that is the lateral direction of the magnetic sensor device, is defined as X-direction, the longitudinal direction of the magnetic sensor device perpendicular to the transport direction of the detection object, that is the reading width direction, is defined as Y-direction, and the direction perpendicular to an XY plane being a transport surface is defined as Z-direction. These directions are referred to as appropriate.

Embodiment 1

Figure 1:
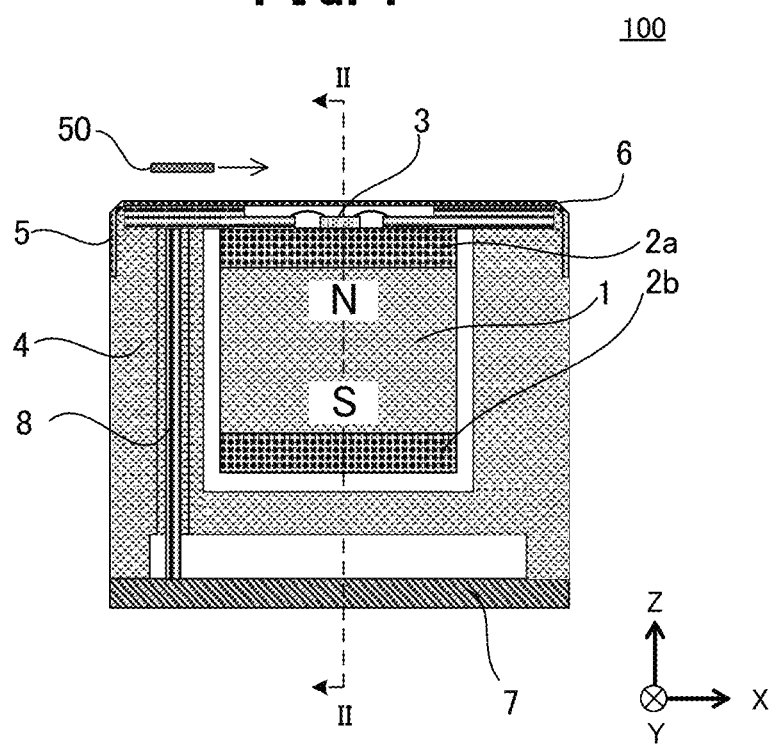
FIG. 1 is a cross-sectional view of a magnetic sensor device according to Embodiment 1 of the present disclosure parallel to a transport direction of a detection object, taken along line I-I in FIG. 2.
Figure 2:
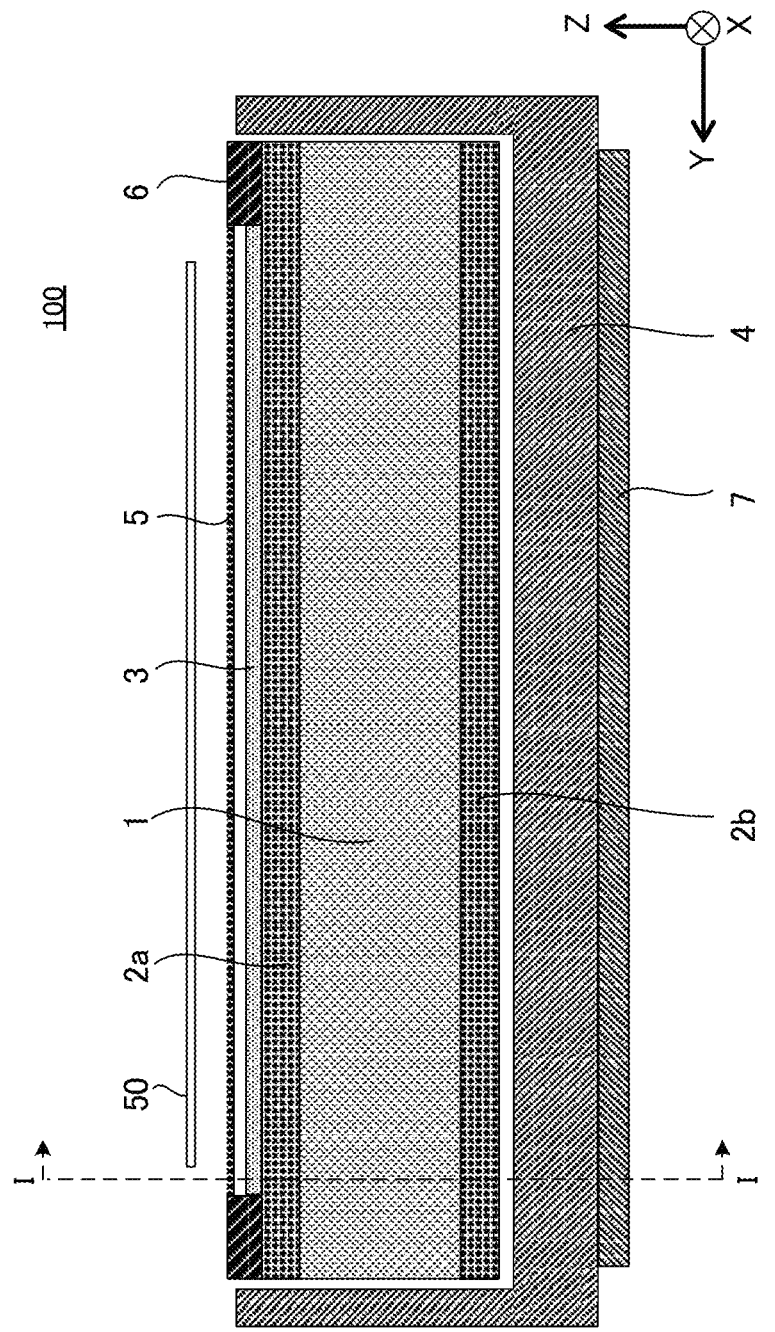
FIG. 2 is a cross-sectional view of the magnetic sensor device according to Embodiment 1 as viewed in an insertion and ejection direction of the detection object, taken along line II-II in FIG. 1.

FIG. 1 is a Z-X cross-sectional view of a magnetic sensor device 100 according to Embodiment 1. FIG. 2 is a Y-Z cross-sectional view of the magnetic sensor device 100. FIG. 3 is a top view of an anisotropic magnetoresistive element chip included in the magnetic sensor device 100. FIG. 1 corresponds to a cross-section taken along line I-I in FIG. 2. FIG. 2 corresponds to a cross-section taken along line II-II in FIG. 1.

As illustrated, the magnetic sensor device 100 includes a magnet 1 for generating a bias magnetic field, yokes 2a and 2b forming a magnetic circuit, an anisotropic magnetoresistive element chip 3 for outputting a change in a magnetic field as a change in a resistance, a housing 4 accommodating the magnet 1 and the yokes 2a and 2b, a metal shield plate 5 as a shield against magnetism, a circuit board 6 for detecting a change in the resistance of a magnetoresistive element, and a signal processing circuit board 7 for processing a detection signal output from the circuit board 6.

The magnet 1 includes a permanent magnet having the north pole and the south pole in Z-direction and being rectangular parallelepiped shape being long in Y-direction and short in X-direction. The magnet 1 forms a magnetic field generation unit that applies a bias magnetic field to the anisotropic magnetoresistive element chip 3.

The yokes 2a and 2b are soft magnetic plates such as iron plates. The yoke 2a is located on the upper surface of the magnet 1. The yoke 2b is located on the lower surface of the magnet 1. The yokes 2a and 2b transmit a magnetic flux generated by the magnet 1. The yokes 2a and 2b are part of the magnetic field generation unit. The yokes 2a and 2b may be eliminated or may be arranged as appropriate.

The anisotropic magnetoresistive element chip 3 (hereafter, AMR chip 3) is located on the upper surface of the yoke 2a and outputs a change in an applied magnetic flux as a change in a resistance. The AMR chip 3 is described in detail later.

The housing 4 is formed from a resin or a ceramic material. The housing 4 is a box having an opening in the upper surface and accommodates the magnet 1 and the yokes 2a and 2b.

The metal shield plate 5 covers and protects the circuit board 6 and the surface of the AMR chip 3 facing a transport path of a detection object 50. The metal shield plate 5 is not magnetized and transmits magnetic field lines.

The circuit board 6 is located on the upper surface of the yoke 2a to surround the AMR chip 3. The circuit board 6 applies a power supply voltage VDD and a grounding voltage GND to the AMR chip 3 and outputs detection signals indicating changes in the resistance of magnetoresistive elements.

The signal processing circuit board 7 is located under the housing 4 and connected to the circuit board 6 with a cable 8. The signal processing circuit board 7 processes the detection signals to detect the detection object 50.

The detection object 50 is a sheet object, such as a banknote, having printing with a magnetic material such as magnetic ink. The detection object 50 is transported in the positive X-direction.

The AMR chip 3 is described in detail with reference to FIG. 3.

The AMR chip 3 includes eight pairs of anisotropic magnetoresistive elements 31a and anisotropic magnetoresistive elements 31b. The anisotropic magnetoresistive elements 31a and 31b in each pair are arranged on imaginary lines and are axisymmetric with respect to a central axis Cx passing through the center of the AMR chip 3 in X-direction and extending in Y-direction, that is the longitudinal direction of the AMR chip 3.

The anisotropic magnetoresistive elements 31a and 31b each have long sides and short sides in a plan view. The short sides extend in a magnetosensitive direction. The long sides extend in a non-magnetosensitive direction.

Each anisotropic magnetoresistive element 31a is an example of a first resistor. Each anisotropic magnetoresistive element 31b is an example of a second resistor. The anisotropic magnetoresistive elements 31a and 31b in each pair are arranged such that the central axis Cx in the longitudinal direction matches the center of the magnetic field generator, including the magnet 1 and the yokes 2a and 2b, in X-direction. The anisotropic magnetoresistive elements 31a and the anisotropic magnetoresistive elements 31b are axisymmetric with respect to the central axis Cx in the longitudinal direction.

The anisotropic magnetoresistive elements 31a and 31b are at a distance from each other that increases or decreases in Y-direction. At least two sets of the anisotropic magnetoresistive elements 31a and 31b are arranged so as to be axisymmetric with respect to a central axis Cy of the magnetic field generator including the magnet 1 and the yokes 2a and 2b in Y-direction. The central axis Cy passes through the center of the AMR chip 3 in Y-direction and extends in X-direction, that is the lateral direction of the AMR chip 3.

Figure 3A:
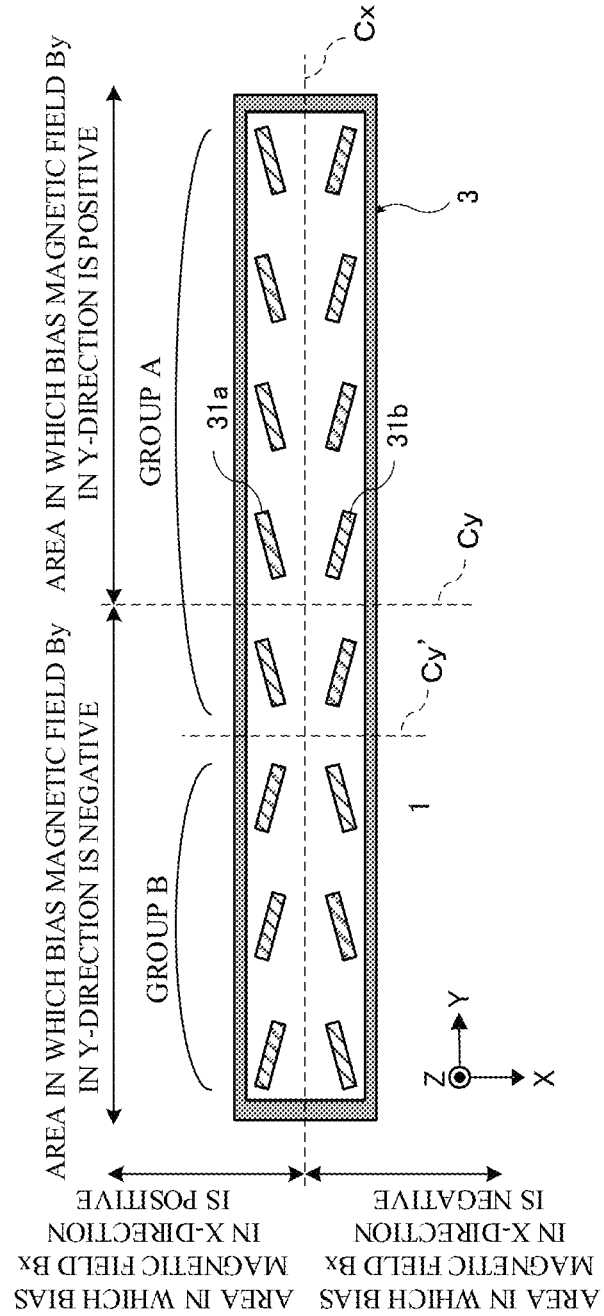
FIG. 3A is a schematic diagram of an anisotropic magnetoresistive element chip (AMR chip) in Embodiment 1, including a layout of multiple pairs of magnetoresistive elements.

More specifically, in the example in FIG. 3A, the area in the positive Y-direction from an imaginary line Cy' perpendicular to the longitudinal direction of the magnet 1 includes five pairs that are five sets, of the anisotropic magnetoresistive elements 31a and 31b that are arranged to have a larger distance from each other as the value Y increases. The area in the negative Y-direction from the imaginary line Cy' includes three pairs that are three sets, of the anisotropic magnetoresistive elements 31a and 31b that are arranged to have a smaller distance from each other as the value Y increases. This causes the three sets of the anisotropic magnetoresistive elements 31a and 31b in each area, and six sets in total, to be axisymmetric with respect to the central axis Cy in Y-direction. The five sets of the anisotropic magnetoresistive elements 31a and 31b are included in a group A. The distance between the anisotropic magnetoresistive elements 31a and 31b in each set in the group A increases as the value Y increases. The three sets of the anisotropic magnetoresistive elements 31a and 31b are included in a group B. The distance between the anisotropic magnetoresistive elements 31a and 31b in each set in the group B decreases as the value Y increases. Further, the anisotropic magnetoresistive elements 31a in the five sets in the group A and in the three sets in the group B and the anisotropic magnetoresistive elements 31b in the five sets in the group A and in the three sets in the group B are axisymmetric with respect to the central axis Cx in Y-direction.

Figure 3B:
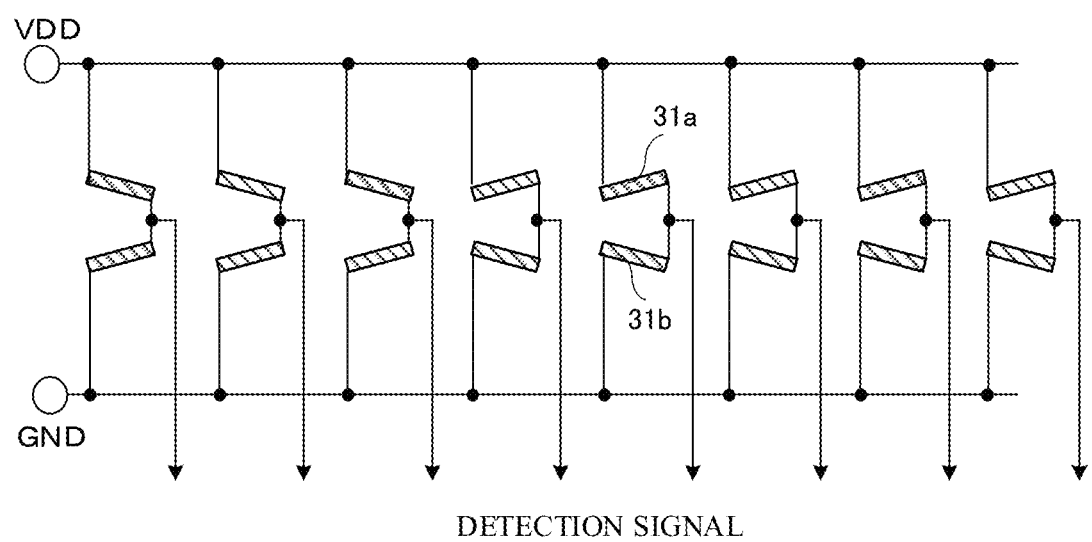
FIG. 3B is a circuit diagram of the AMR chip in Embodiment 1.

As illustrated in FIG. 3B, the circuit board 6 applies the power supply voltage VDD to a first end of each anisotropic magnetoresistive element 31a. The circuit board 6 applies the grounding voltage GND to a first end of each anisotropic magnetoresistive element 31b. The anisotropic magnetoresistive element 31a and the anisotropic magnetoresistive element 31b in each pair have second ends short-circuited, from which an output signal from each pair is output to the circuit board 6 through an output signal line.

In this structure, the power supply voltage VDD is divided at the ratio between the resistance of the anisotropic magnetoresistive element 31a and the resistance of the anisotropic magnetoresistive element 31b and is output to the output signal line as a detection signal.

When the detection object 50 containing a magnetic material moves on the transport path, the magnetic field applied to each of the anisotropic magnetoresistive elements 31a and 31b changes. The resistances of the anisotropic magnetoresistive elements 31a and 31b change accordingly, thus changing the voltage division ratio of each pair and changing the voltages of the detection signals. The circuit board 6 transmits the detection signals to the signal processing circuit board 7. The signal processing circuit board 7 processes the detection signals to detect the detection object 50.

The structure of the above magnetic sensor device 100 for applying a bias magnetic field to the anisotropic magnetoresistive elements 31a and 31b is described.

Figure 4:
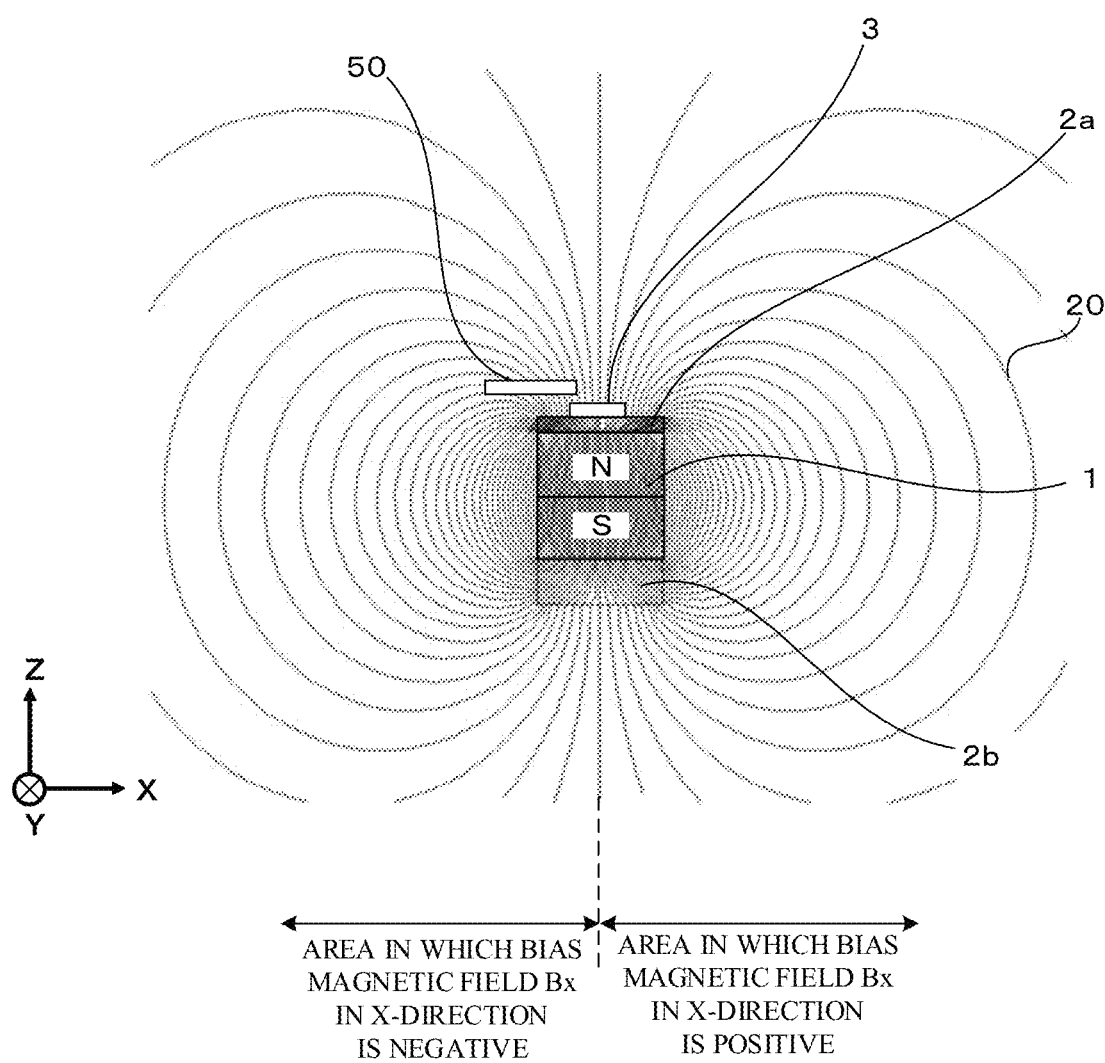
FIG. 4 is a diagram illustrating the distribution of a magnetic field generated by a magnet in Embodiment 1.

FIG. 4 is a diagram illustrating the distribution of magnetic field lines output from the magnetic field generation unit including the magnet 1 and the yokes 2a and 2b. In FIG. 4, the components relevant to the distribution of the magnetic field lines are illustrated, and the other components are not illustrated. As illustrated in FIG. 4, in an XZ plan, magnetic field lines 20 emitted from the north pole of the magnet 1 pass through the yoke 2a and leave the XY plane and the YZ plane of the yoke 2a out of the magnet 1 and the yoke 2a. The magnetic field lines 20 out of the magnet 1 and the yoke 2a enter the yoke 2b on the south pole of the magnet 1 through the XY plane and the YZ plane of the yoke 2b. The magnetic field lines 20 entering the yoke 2b gather at the south pole of the magnet 1 through the yoke 2b.

The central axis of the AMR chip 3 in X-direction, that is the central axis Cx in the longitudinal direction, is at the center of the magnet 1 and the yoke 2a in X-direction. Similarly, the central axis in Y-direction perpendicular to the longitudinal direction of the AMR chip 3, that is the central axis Cy, is at the center of the magnet 1 and the yoke 2a in Y-direction.

Thus, a positive component Bx of the magnetic field indicated by the magnetic field lines 20 in X-direction acts as a bias magnetic field in X-direction for the anisotropic magnetoresistive elements 31a. In contrast, a negative component Bx in the negative X-direction acts as the bias magnetic field in X-direction for the anisotropic magnetoresistive elements 31b on the anisotropic magnetoresistive elements 31b. This relationship is illustrated in FIGS. 3A and 4. This bias magnetic field allows stable application of a magnetic field in the longitudinal directions of the anisotropic magnetoresistive elements 31a and 31b. This reduces the hysteresis for the anisotropic magnetoresistive elements 31a and 31b. The anisotropic magnetoresistive elements 31a and 31b can thus have stable output.

The AMR chip 3 and the magnet 1 are longer in Y-direction than in X-direction. Thus, a magnetic field applied in Y-direction substantially has the intensity distribution shown in FIG. 5. More specifically, in the plan view in FIG. 3A, a magnetic field in the positive Y-direction is theoretically applied in the area in the positive Y-direction, that is the right area, from the central axis Cy. A magnetic field in the negative Y-direction is applied in the area in the negative Y-direction, that is the left area, from the central axis Cy. However, a bias magnetic field By in Y-direction can be considered almost zero in the central area, that is within the range (a) in FIG. 5.

Figure 5:
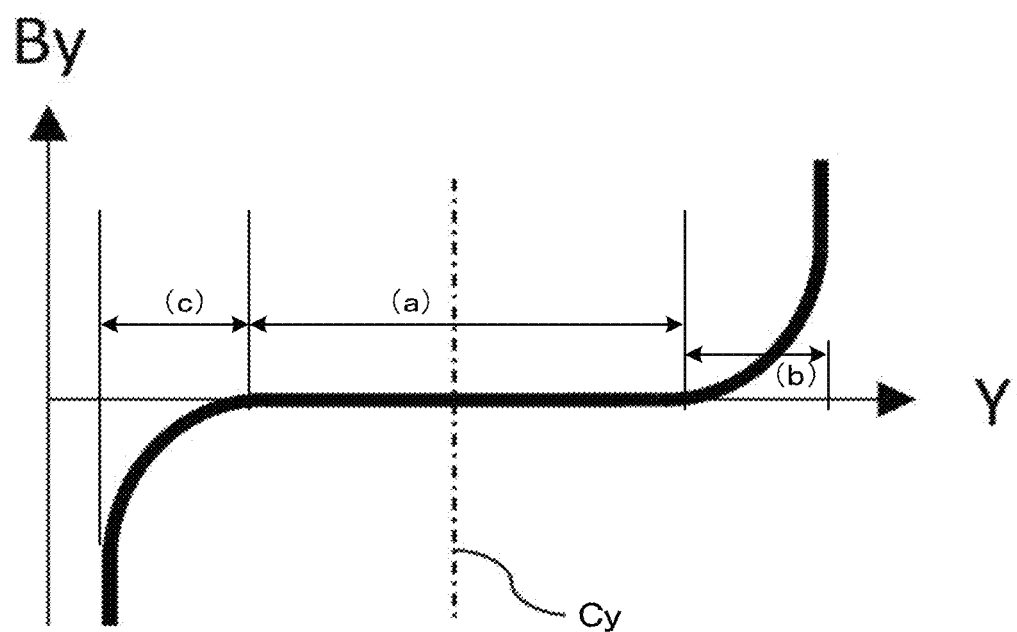
FIG. 5 is a graph showing the distribution of a bias magnetic field By in Y-direction applied to the magnetoresistive elements in FIG. 1.
Figure 6A:
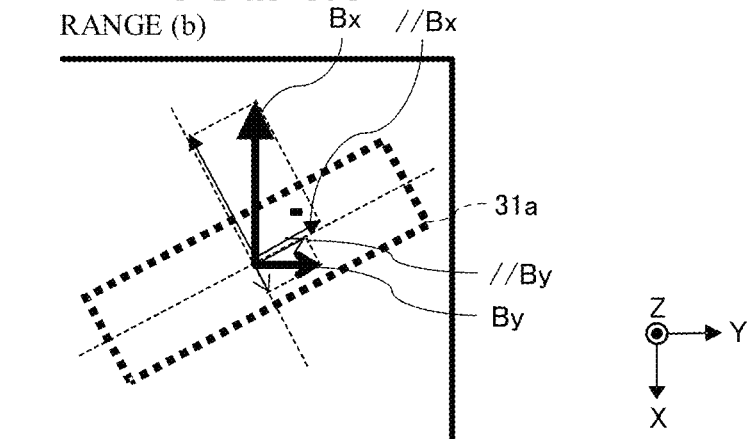
FIG. 6A is a diagram illustrating a component of a magnetic field applied to one of the magnetoresistive elements illustrated in FIG. 3A in the longitudinal direction.

The arrangement in the range (b) in FIG. 5 corresponding to the end in the positive Y-direction from the central axis Cy, that is the range in the right end of the drawing, is described. As illustrated in FIG. 6A, the magnetic field applied in the longitudinal direction of the anisotropic magnetoresistive element 31a is the sum of a component //Bx of the bias magnetic field Bx in X-direction in the longitudinal direction of the anisotropic magnetoresistive element 31a and a component //By of the bias magnetic field By in Y-direction in the longitudinal direction of the anisotropic magnetoresistive element 31a. The bias magnetic field in the longitudinal direction of the anisotropic magnetoresistive element 31a is thus stably supplied from both the bias magnetic field Bx in X-direction and the bias magnetic field By in Y-direction.

Figure 6B:
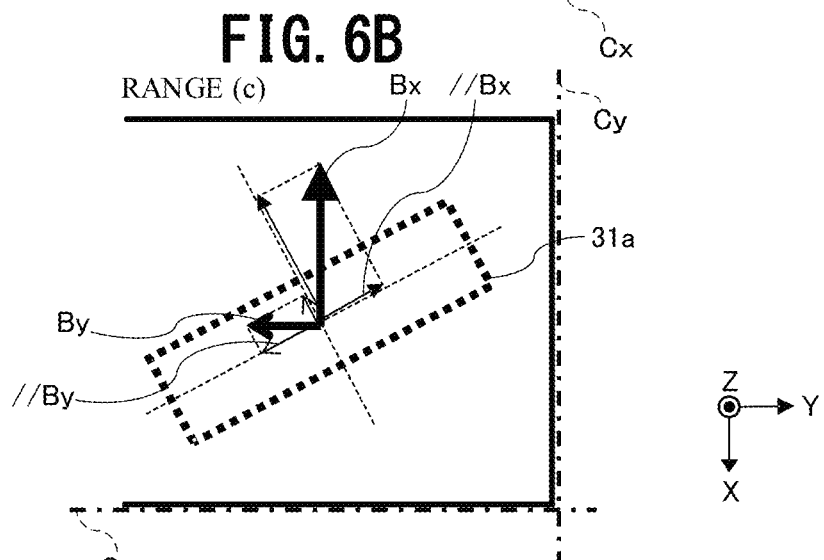
FIG. 6B is a diagram illustrating the component of the magnetic field applied to one of the magnetoresistive elements illustrated in FIG. 3A in the longitudinal direction.

The arrangement in the range (c) in FIG. 5 corresponding to the end in the negative Y-direction from the central axis Cy, that is the left end of the drawing, is described. As illustrated in FIG. 6B, the bias magnetic field By in Y-direction is in the negative Y-direction. In contrast, the bias magnetic field Bx in X-direction is the same as in FIG. 6A. In the example below, the anisotropic magnetoresistive elements 31a and 31b in the range (c) have a larger distance from each other as the value Y increases. In this example, the component //Bx of the bias magnetic field Bx in X-direction in the longitudinal direction of the anisotropic magnetoresistive element 31a and the component //By of the bias magnetic field By in Y-direction in the longitudinal direction of the anisotropic magnetoresistive element 31a are in opposite directions, and thus offset each other in the magnetic field applied in the longitudinal direction of the anisotropic magnetoresistive element 31a. The bias magnetic field in the longitudinal direction is thus the difference between the component //Bx and the component //By. The anisotropic magnetoresistive element 31a receives a small bias magnetic field in the longitudinal direction and is thus likely to be affected by hysteresis.

In the structure in FIG. 3A, the area in the negative Y-direction from the imaginary line Cy' perpendicular to the longitudinal direction of the magnet 1 includes the three sets of the anisotropic magnetoresistive elements 31a and 31b that are arranged to have a smaller distance from each other as the value Y increases.

Figure 6C:
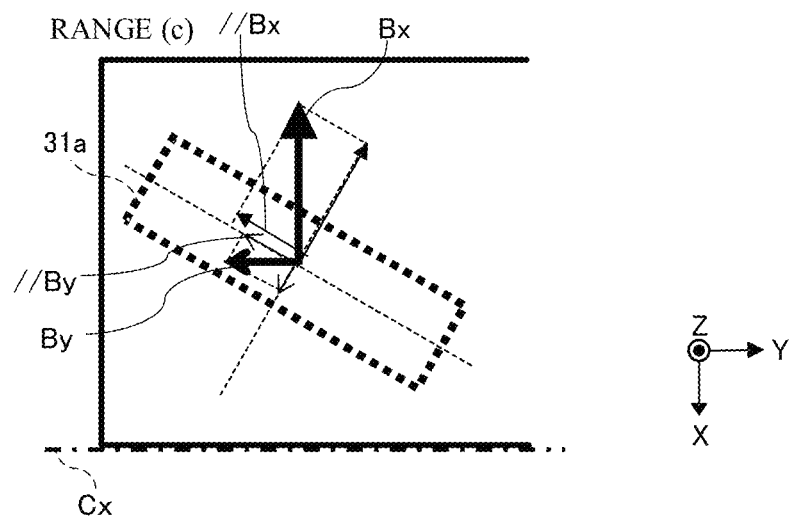
FIG. 6C is a diagram illustrating the component of the magnetic field applied to one of the magnetoresistive elements illustrated in FIG. 3A in the longitudinal direction.

In this case, as illustrated in FIG. 6C, a component of the magnetic field applied in the longitudinal direction of the anisotropic magnetoresistive element 31a is the sum of the component //Bx of the bias magnetic field Bx in X-direction in the longitudinal direction of the anisotropic magnetoresistive element 31a and the component //By of the bias magnetic field By in Y-direction in the longitudinal direction of the anisotropic magnetoresistive element 31a, where Bx is the bias magnetic field in X-direction and By is the bias magnetic field in the negative Y-direction. The bias magnetic field in the longitudinal direction of the anisotropic magnetoresistive element 31a is thus stably supplied from both the bias magnetic field Bx in X-direction and the bias magnetic field By in Y-direction in the anisotropic magnetoresistive elements 31a and 31b in the range (c) in FIG. 5 that are arranged to have a smaller distance from each other as the value Y increases.

In the present embodiment, as described above, at least more than one pair of the anisotropic magnetoresistive elements 31a and 31b in the end areas of the magnet with the direction of the bias magnetic field By in Y-direction being positive or negative receive the bias magnetic field in the longitudinal directions of the anisotropic magnetoresistive elements 31a and 31b that is the sum of the bias magnetic field Bx in X-direction and the bias magnetic field By in Y-direction. This structure allows more stable output in a wider area, particularly in the area near the ends, than the arrangement illustrated in FIG. 9 in Patent Literature 1 in which the distance between the anisotropic magnetoresistive element 31a and the anisotropic magnetoresistive element 31b in all pairs increases in the same direction.

Further, the magnetic sensor device 100 according to the present embodiment has more uniform sensitivity distribution and thus has more uniform signal distribution.

Embodiment 2

Figure 7:
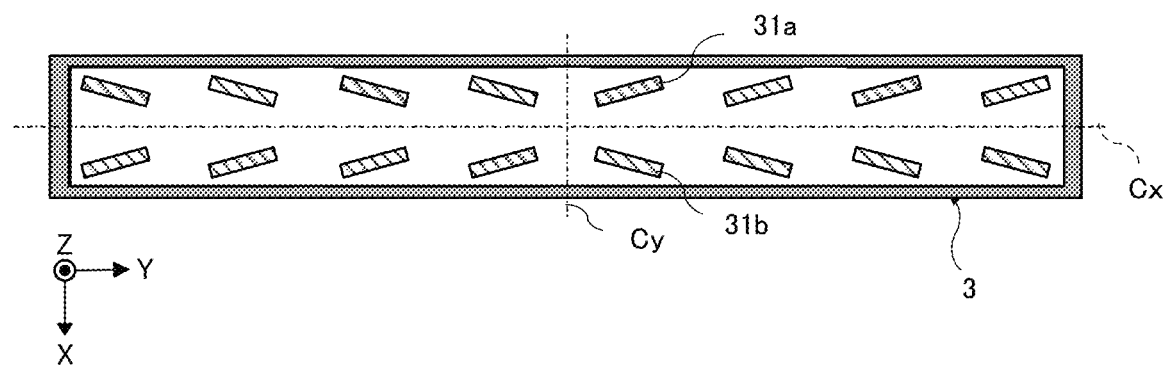
FIG. 7 is a top view of an AMR chip included in a magnetic sensor device according to Embodiment 2 of the present disclosure.

In Embodiment 1, at least two sets, or more specifically six sets that are six pairs, of the anisotropic magnetoresistive element 31a and the anisotropic magnetoresistive element 31b are axisymmetric with respect to the central axis Cy. However, the structure is not limited to this. At least two sets of the anisotropic magnetoresistive element 31a and the anisotropic magnetoresistive element 31b may simply be axisymmetric with respect to the central axis Cy. For example, as illustrated in FIG. 7, all four sets of the anisotropic magnetoresistive element 31a and the anisotropic magnetoresistive element 31b in the area in the positive Y-direction from the central axis Cy and all four sets of the anisotropic magnetoresistive element 31a and the anisotropic magnetoresistive element 31b in the area in the negative Y-direction from the central axis Cy that are eight sets in total, may be axisymmetric with respect to the central axis Cy. By arranging pairs of the anisotropic magnetoresistive elements 31a and 31b axisymmetric, the manufacture of multiple types of AMR chips 3 is not required but simply it is required a single original pattern prepared for the anisotropic magnetoresistive elements 31a and 31b on the AMR chip 3. This structure is less costly.

Figure 8:
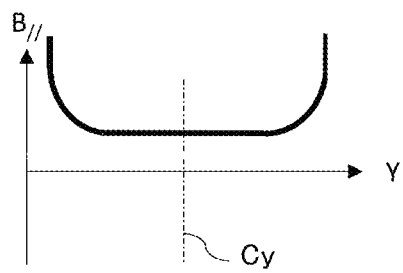
FIG. 8 is a graph showing the relationship between the positions of the magnetoresistive elements in the AMR chip illustrated in FIG. 7 in Y-direction and the strength of the magnetic field applied in the longitudinal directions of the magnetoresistive elements.
Figure 9:
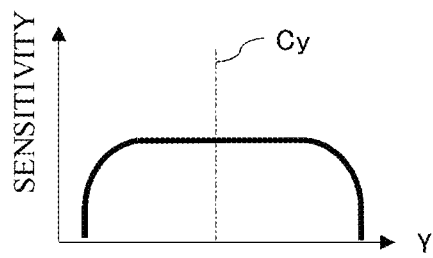
FIG. 9 is a graph showing the relationship between the positions of the magnetoresistive elements in the AMR chip illustrated in FIG. 7 in Y-direction and the sensitivity of the magnetoresistive elements.

In this case, as illustrated in FIG. 8, the bias magnetic field B// in the longitudinal direction of each of the anisotropic magnetoresistive elements 31a and 31b is substantially uniform at any position in Y-direction. As illustrated in FIG. 9, the sensitivity is also substantially uniform at any position in Y-direction.

Embodiment 3

A magnetic sensor device 100 according to Embodiment 3 is described with reference to FIG. 10. In FIG. 10, components that are the same or equivalent to those illustrated in FIG. 3A are assigned the same reference numerals, and explanation for such components is omitted.

Figure 10A:
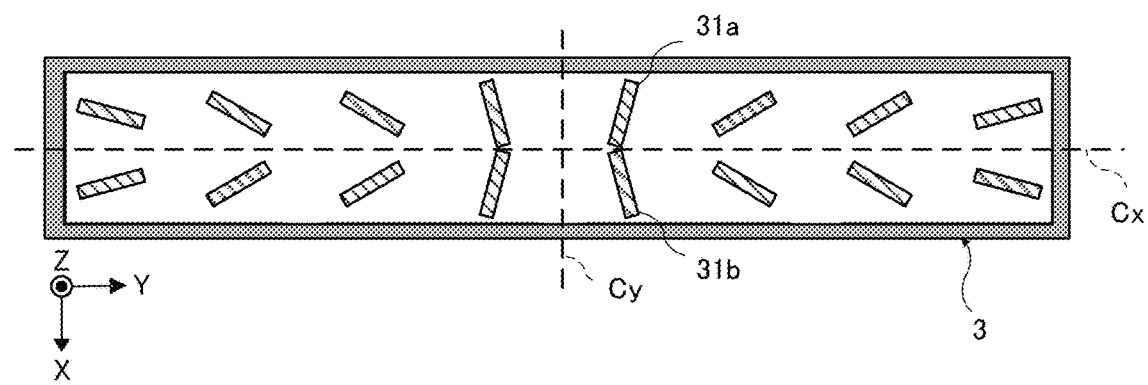
FIG. 10A is a top view of an AMR chip included in a magnetic sensor device according to Embodiment 3 of the present disclosure.
Figure 10B:
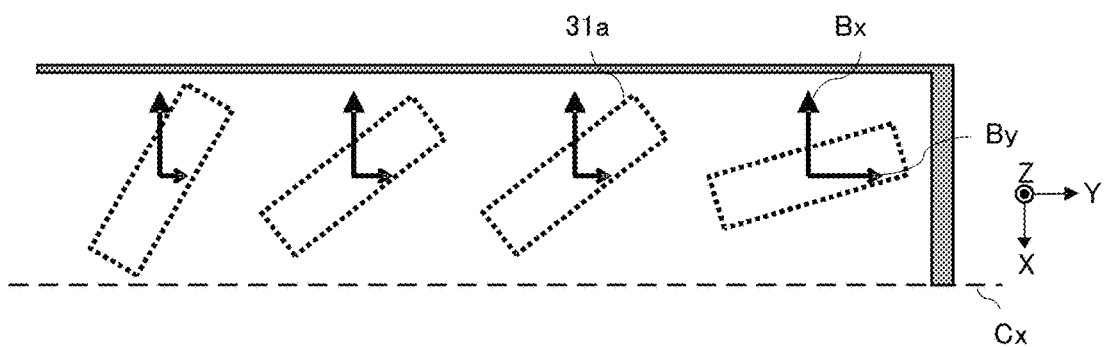
FIG. 10B is a diagram illustrating the orientations of the magnetoresistive elements illustrated in FIG. 10A.
Figure 10C:
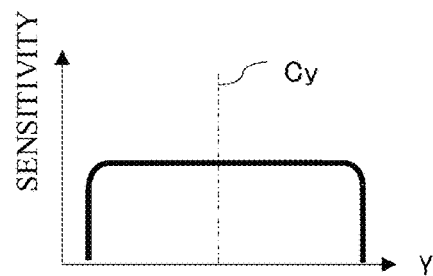
FIG. 10C is a graph showing the relationship between the positions of the magnetoresistive elements in the AMR chip illustrated in FIG. 10A in Y-direction and the sensitivity of the magnetoresistive elements.

FIG. 10A is a plan view of an AMR chip 3 included in the magnetic sensor 100 according to Embodiment 3. In this structure, the anisotropic magnetoresistive elements 31a and the anisotropic magnetoresistive elements 31b are arranged such that the angle formed therebetween is larger at a position closer to a central axis Cy corresponding to the midpoint in Y-direction being the longitudinal direction of a magnetic field generator including a magnet 1 and yokes 2a and 2b. The anisotropic magnetoresistive elements 31a and the anisotropic magnetoresistive elements 31b each have the same size. As schematically illustrated in FIG. 10B, each anisotropic magnetoresistive element 31a receives a magnetic field that varies less at different positions in Y-direction. This allows more uniform sensitivity distribution as illustrated in FIG. 10C and allows more uniform signal distribution.

Embodiment 4

A magnetic sensor device according to Embodiment 4 is described with reference to FIG. 11.

In FIG. 11, components that are equivalent to those illustrated in FIG. 3 are assigned the same reference numerals, and explanation for such components is omitted.

In the present embodiment, as illustrated in FIG. 11, anisotropic magnetoresistive elements 31a and 31b closer to a central axis Cy corresponding to the midpoint in Y-direction being the longitudinal direction of a magnetic field generator including a magnet 1 and yokes 2a and 2b, have a width W smaller than anisotropic magnetoresistive elements 31a and 31b farther away from the central axis Cy.

In FIG. 11, the magnitude of a bias magnetic field By in Y-direction is small at the central axis Cy. The bias magnetic field By in Y-direction is larger at a position farther from the central axis Cy. This causes the sensitivities of the anisotropic magnetoresistive elements 31a and 31b to be lower. The anisotropic magnetoresistive elements 31a and 31b thus have the width W larger at a position farther from the central axis Cy to cause output values from the anisotropic magnetoresistive elements 31 and 31b to remain unchanged. This causes the magnetic sensor device 100 to appear to have more uniform sensitivity distribution, thus allowing uniform signal distribution.

Modification

The anisotropic magnetoresistive elements 31a and 31b may have a thickness, that is a size in Z-direction, that varies depending on the position, rather than or in addition to having the width W that varies depending on the position as illustrated in FIG. 11. More specifically, the anisotropic magnetoresistive elements 31a and 31b closer to the central axis Cy may have a larger thickness, that is a thicker structure, than the anisotropic magnetoresistive elements 31a and 31b farther away from the central axis Cy. The anisotropic magnetoresistive elements have a higher sensitivity when they have a thinner resistance film. Adjusting the thickness of the anisotropic magnetoresistive elements can thus produce the same advantageous effects as in Embodiment 4.

The structures described in Embodiments 1 to 4 may be part of the areas in a magnetic sensor device.

Being symmetric herein does not refer to being precisely symmetric. The anisotropic magnetoresistive elements 31a and 31b included in the magnetic sensor device 100 according to the embodiments may have, with respect to the central axis Cy, a symmetric deviation permissible to function as a magnetic sensor, a symmetric deviation resulting from manufacturing variations, or a partial symmetric deviation for other functions. The symmetric deviations may include deviations in size, position, angle, and orientation.

In the above embodiments, the anisotropic magnetoresistive elements 31a and 31b are sheet resistors. In some embodiments, the anisotropic magnetoresistive elements 31a and 31b may be resistors each with a meandered or folded pattern, as illustrated in FIG. 10 in Japanese Patent No. 6316429 (Patent Literature 1). The width W of each of the anisotropic magnetoresistive elements 31a and 31b may be proportional to the number of times the resistor is folded. More specifically, the anisotropic magnetoresistive elements 31a and 31b with a smaller width each have fewer folds and thus have a less resistance, whereas the anisotropic magnetoresistive elements 31a and 31b with a larger width W each have more folds and thus have a greater resistance.

Each embodiment of the present disclosure may be combined, altered, or eliminated as appropriate within the scope of the present disclosure. For example, although the anisotropic magnetoresistive elements are examples of resistors to be magnetoresistive elements, giant magnetoresistive (GMR) elements or tunnel magnetoresistive (TMR) elements may be used to produce the same advantageous effects.

Although eight pairs that are eight sets, of magnetoresistive elements are used in the above embodiments, any number of pairs may be used. Pairs or sets of magnetoresistive elements to be axisymmetric may be any number of pairs or sets that are at least two pairs or sets in total including one set in the positive Y-direction from the central axis Cy and one set in the negative Y-direction.

Although the anisotropic magnetoresistive elements 31a and the anisotropic magnetoresistive elements 31b are axisymmetric with respect to the central axis Cx in the longitudinal direction of the magnetic field generation unit in the examples, they may be arranged in any other manner than being axisymmetric in some embodiments.

The device structure, the circuit structure, and other structures are examples, and may be changed as appropriate.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application claims the benefit of Japanese Patent Application No. 2019-144767, filed on Aug. 6, 2019, the entire disclosure of which is incorporated by reference herein.

REFERENCE SIGNS LIST

1 Magnet
2a, 2b Yoke
3 Anisotropic magnetoresistive element chip
4 Housing
5 Metal shield plate
6 Circuit board
7 Signal processing circuit board
8 Cable
31a, 31b Anisotropic magnetoresistive element

The invention claimed is:
1. A magnetic sensor device comprising:
a magnetic field generator to generate a magnetic field intersecting with a detection object; and
a plurality of sets of magnetoresistive elements arranged on a line in a longitudinal direction, the longitudinal direction being perpendicular to a transport direction of the detection object, wherein
each of the plurality of sets of magnetoresistive elements includes a first resistor and a second resistor arranged with a distance therebetween in the transport direction, a midpoint of the first resistor and the second resistor being matched with a center of the magnetic field generator in the transport direction,
the magnetic field generator is configured to apply to a plurality of the first resistors and a plurality of the second resistors the magnetic field including a component in the transport direction of the detection object and a component in the longitudinal direction,
the first resistor and the second resistor in each of the plurality of sets of magnetoresistive elements are arranged such that the distance increases from a distance between first ends of the first resistor and the second resistor in the longitudinal direction to a distance between second ends of the first resistor and the second resistor in the longitudinal direction, and at least two sets of the plurality of sets of magnetoresistive elements are arranged so as to be axisymmetric with respect to an axisymmetric axis of the magnetic field generator that is perpendicular to the longitudinal direction, a first group of the plurality of sets of magnetoresistive elements is arranged on a first side, in the longitudinal direction, of a central axis of the magnetic field generator in the longitudinal direction, the central axis crossing a center, in the longitudinal direction, of the magnetic field generator and extending perpendicular to the longitudinal direction, a second group of the plurality of sets of magnetoresistive elements is arranged on a second side, in the longitudinal direction, of the central axis, in each set of magnetoresistive elements in the first group, the first ends of the first resistor and the second resistor is closer to the central axis than the second ends of the first resistor and the second resistor, and in all but one set of magnetoresistive elements in the second group, the first ends of the first resistor and the second resistor is closer to the central axis than the second ends of the first resistor and the second resistor.

2. The magnetic sensor device according to claim 1, wherein the first resistor and the second resistor in each of the plurality of sets of magnetoresistive elements are axisymmetric with respect to an axis parallel to the longitudinal direction.

3. A magnetic sensor device comprising:
a magnetic field generator to generate a magnetic field intersecting with a detection object; and
a plurality of sets of magnetoresistive elements arranged on a line in a longitudinal direction, the longitudinal direction being perpendicular to a transport direction of the detection object, wherein
each of the plurality of sets of magnetoresistive elements includes a first resistor and a second resistor arranged with a distance therebetween in the transport direction, a midpoint of the first resistor and the second resistor being matched with a center of the magnetic field generator in the transport direction, the magnetic field generator is configured to apply to a plurality of the first resistors and a plurality of the second resistors the magnetic field including a component in the transport direction of the detection object and a component in the longitudinal direction, the first resistor and the second resistor in each of the plurality of sets of magnetoresistive elements are arranged such that the distance increases from a distance between first ends of the first resistor and the second resistor in the longitudinal direction to a distance between second ends of the first resistor and the second resistor in the longitudinal direction, at least two sets of the plurality of sets of magnetoresistive elements are arranged so as to be axisymmetric with respect to an axisymmetric axis of the magnetic field generator that is perpendicular to the longitudinal direction, the first resistor and the second resistor in each of the plurality of sets of magnetoresistive elements are arranged with a longest side of each resistor being arranged at an orientation angle with respect to a central axis of the magnetic field generator, and the orientation angle of each of the first resistor and the second resistor in a first set of the plurality of sets of magnetoresistive elements being equal to or smaller than the orientation angle of each of the first resistor and the second resistor in a second set of the plurality of sets of magnetoresistive elements, the first set of the plurality of sets of magnetoresistive elements being closer to the central axis than the second set of the plurality of sets of magnetoresistive elements, and an orientation angle of the first and second resistors in a set of the plurality of sets of magnetic resistive elements that is closer to the central axis of the magnetic field generator in the longitudinal direction is different than an orientation angle of the first and second resistors in a set of the plurality of sets of magnetic resistive elements that is the farthest from the central axis in the longitudinal direction, the central axis crossing a center of the magnetic field generator extending perpendicular to the longitudinal direction.

\* \* \* \* \*